(12) United States Patent
Singh et al.

(10) Patent No.: US 9,118,342 B2
(45) Date of Patent: Aug. 25, 2015

(54) LOW POWER EXCESS LOOP DELAY COMPENSATION TECHNIQUE FOR DELTA-SIGMA MODULATORS

(71) Applicant: Texas Instruments Incorporated, Dallas, TX (US)

(72) Inventors: Vikas Singh, Bangalore (IN); Anand Kannan, Bangalore (IN); Ashish Lachhwani, Bangalore (IN)

(73) Assignee: TEXAS INSTRUMENTS INCORPORTED, Dallas, TX (US)

( * ) Notice: Subject to any disclaimer, the term of this patent is extended or adjusted under 35 U.S.C. 154(b) by 46 days.

(21) Appl. No.: 14/033,047

(22) Filed: Sep. 20, 2013

(65) Prior Publication Data
US 2015/0084797 A1    Mar. 26, 2015

(51) Int. Cl.
*H03M 3/00* (2006.01)
*H03M 1/00* (2006.01)
*H03M 1/46* (2006.01)

(52) U.S. Cl.
CPC ............. *H03M 3/372* (2013.01); *H03M 1/002* (2013.01); *H03M 1/46* (2013.01)

(58) Field of Classification Search
CPC ....... H03M 3/32; H03M 3/418; H03M 3/456; H03M 3/454

USPC ................................................... 341/143–165
See application file for complete search history.

(56) References Cited

U.S. PATENT DOCUMENTS

| | | | | |
|---|---|---|---|---|
| 5,068,661 | A * | 11/1991 | Kaneaki et al. | 341/143 |
| 5,084,702 | A * | 1/1992 | Ribner | 341/143 |
| 5,103,229 | A * | 4/1992 | Ribner | 341/143 |
| 5,140,325 | A * | 8/1992 | Yu et al. | 341/143 |
| 5,870,048 | A * | 2/1999 | Kuo et al. | 341/143 |
| 6,300,890 | B1 * | 10/2001 | Okuda et al. | 341/143 |
| 6,359,576 | B1 * | 3/2002 | Petrofsky | 341/143 |
| 6,373,418 | B1 * | 4/2002 | Abbey | 341/143 |
| 2008/0291069 | A1 * | 11/2008 | Inukai et al. | 341/143 |

* cited by examiner

*Primary Examiner* — Lam T Mai
(74) *Attorney, Agent, or Firm* — John R. Pessetto; Charles A. Brill; Frank D. Cimino

(57) ABSTRACT

A delta sigma modulator with an input stage and an output stage. The input stage receives an analog input signal and an output of a first digital to analog converter (DAC). The input stage generates a processed error signal. An additional summation device receives the processed error signal. The output stage receives an output of the additional summation device and generates a delayed digital output signal. A differentiator and the first digital to analog converter (DAC) receive the delayed digital output signal as a feedback signal. A second DAC receives an output of the differentiator and provides an output to an additional negative feedback coefficient multiplier. The additional summation device receives an output of the additional negative feedback coefficient multiplier.

20 Claims, 4 Drawing Sheets

FIG. 6

| BLOCK | POWER (μW) | |
|---|---|---|
| | DELTA SIGMA MODULATOR 100 | DELTA SIGMA MODULATOR 300 |
| Gm CELL | 14 | 14 |
| SUMMER | 35 | 0 |
| QUANTIZER | 8 | 8 |
| DAC | 6 | 7 |
| OTHER | 11 | 11 |
| TOTAL POWER | 75 | 40 |

ROW 2 → SUMMER row

COLUMN 1 / COLUMN 2

LOW POWER EXCESS LOOP DELAY COMPENSATION TECHNIQUE FOR DELTA-SIGMA MODULATORS

TECHNICAL FIELD

Embodiments of the disclosure relate to analog-to-digital converters (ADCs) and more particularly to Continuous time Delta Sigma Modulator (CTDSM) which is one of the most widely used ADC architectures.

BACKGROUND

Most electrical systems are digital today and hence require analog-to-digital converters (ADCs) to interface to the outside world. The outside world can either be real world signals such as temperature, pressure, voice, etc., or modulated carriers transmitting information over some kind of medium (analog or digital communication). For all applications, energy efficiency is extremely important and more so for battery operated systems.

Delta sigma architectures are widely used for high resolution, low speed ADCs as well as for medium resolution, high speed ADCs. The more traditional implementation of a delta sigma modulator is in Discrete time Delta Sigma Modulator (DTDSM). DTDSMs are more robust to parameter variations as compared to continuous time delta sigma modulators (CTDSMs). This is because DTDSM parameters generally depend only on capacitor ratios which are well controlled while CTDSM parameters depend on RC time constants which are poorly controlled. However, DTDSMs typically charge and discharge capacitors in every cycle and hence are less power efficient as compared to CTDSM. Hence, CTDSMs are often preferred in energy saving applications such as battery operated equipment, body area networks etc.

A CTDSM is typically designed by starting from the DTDSM architecture and then converting the design to continuous time by using an impulse invariant transform. The CTDSM loop contains integrators, one or more quantizers and one or more feedback DACs (Digital to Analog converters). The quantizers and feedback DACs typically contribute to some delay in the loop which is termed as excess loop delay. DTDSMs do not have an issue with excess loop delay since all activity in a DTDSM occurs only on clock edges and any delay less than a clock cycle is not of significance. However in CTDSMs, the integrators are continuous time in nature i.e. they integrate all the time and hence excess loop delay modifies the transfer function of the loop thus degrading the stability and signal to noise ratio. CTDSMs are also more sensitive to clock jitter as compared to DTDSMs. In spite of all these issues, CTDSMs have gained in popularity due to their inherent energy efficiency. Thus, there is a need for techniques to mitigate the apparent drawbacks of CTDSMs.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides a delta sigma modulator. The delta sigma modulator includes a first summation device that receives an analog input signal and an output signal from a first negative feedback coefficient multiplier. A first integrator receives an output of the first summation device. A second summation device is coupled to the first integrator and receives a signal from a second negative feedback coefficient multiplier. A third summation device is coupled to the second summation device and receives a signal from a third negative feedback coefficient multiplier. A second integrator receives an output of the third summation device. A quantizer receives an output of the second integrator and generates a digital output signal. The digital output signal is received by a delay element which generates a delayed digital output signal. A first digital to analog converter (DAC) provides an output signal to the first negative feedback coefficient multiplier and the second negative feedback coefficient multiplier. The first DAC receives the delayed digital output signal, thereby forming a feedback loop. A second DAC provides an output to the third negative feedback coefficient multiplier and a differentiator provides an output to the second DAC. The differentiator receives the delayed digital output signal as a feedback signal.

Another example embodiment provides a delta sigma modulator that includes a first integrator and a second integrator. The first integrator receives an analog input signal and a signal from a first negative feedback coefficient multiplier. The second integrator is coupled to an output of the first integrator and receives a signal from a second negative feedback coefficient multiplier and a signal from a third negative feedback coefficient multiplier. A quantizer is coupled to an output of the second integrator and generates a digital output signal. A delay element receives the digital output signal and generates a delayed digital output signal. A first digital to analog converter (DAC) provides an output signal to the first negative feedback coefficient multiplier and the second negative feedback coefficient multiplier. The first DAC is receives the delayed digital output signal, thereby forming a feedback loop. A second DAC provides an output to the third negative feedback coefficient multiplier and a differentiator provides an output to the second DAC. The differentiator receives the delayed digital output signal as a feedback signal.

Another embodiment provides a method of generating a delayed digital output signal in a delta sigma modulator. An analog input signal and a first analog signal are integrated to generate a first output signal. The first analog signal, the first output signal and a second analog signal are integrated to generate a second output signal. The second output signal is quantized to generate a digital output signal. The digital output signal is delayed to generate the delayed digital output signal. The first analog signal is generated from the delayed digital output signal.

An example embodiment provides a delta sigma modulator with an input stage and an output stage. The input stage receives an analog input signal and an output of a first digital to analog converter (DAC). The input stage generates a processed error signal. An additional summation device receives the processed error signal and an output of a differentiator. The output stage receives an output of the additional summation device and generates a delayed digital output signal. The output stage includes at least one integrator. The differentiator and the first digital to analog converter (DAC) receive the delayed digital output signal as a feedback signal.

Another embodiment provides a method of generating a delayed digital output signal in a delta sigma modulator from an analog input signal. A processed error signal is generated from the analog input signal and a first analog signal. The processed error signal and a second analog signal are summed to generate a second output signal. The second output signal is integrated and quantized to generate a digital output signal. The digital output signal is delayed to generate a delayed digital output signal.

BRIEF DESCRIPTION OF THE VIEWS OF DRAWINGS

FIG. 6 is a table comparing the power consumed by the Delta Sigma modulators illustrated in FIG. 1 and FIG. 3, according to an embodiment.

DETAILED DESCRIPTION OF THE EMBODIMENTS

Figure 1:
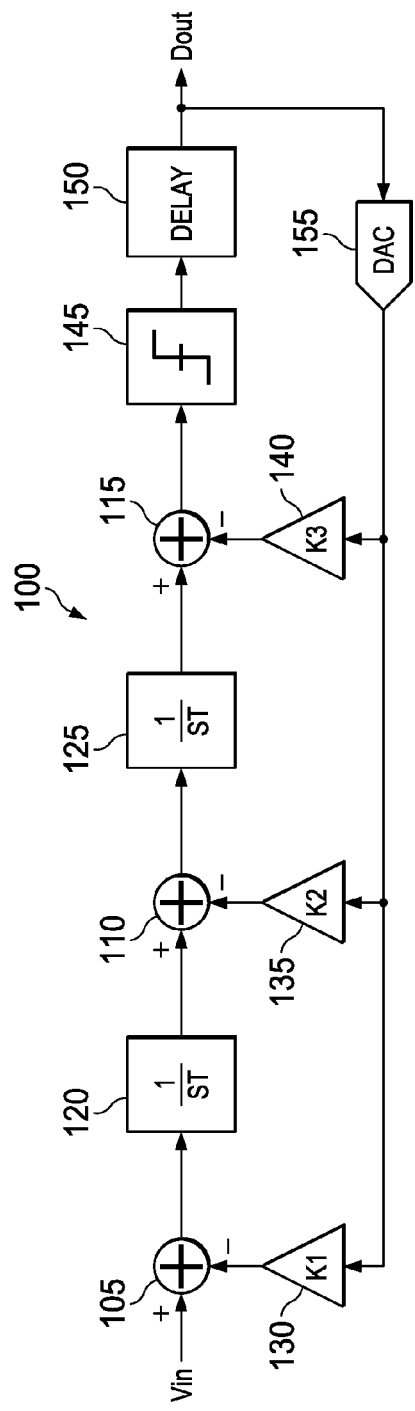
FIG. 1 illustrates architecture of a Delta Sigma modulator.

FIG. 1 illustrates architecture of a delta sigma modulator 100. The delta sigma modulator 100 includes a first summation device 105 that receives an analog input signal Vin. The first summation device 105 also receives output of a first negative feedback coefficient multiplier 130. A first integrator 120 is coupled to an output of the first summation device 105. A second summation device 110 receives output of the first integrator 120. The second summation device 110 also receives output of a second negative feedback coefficient multiplier 135. A second integrator 125 is coupled to an output of the second summation device 110. A third summation device 115 receives output of the second integrator 125. The third summation device 115 also receives output of a third negative feedback coefficient multiplier 140. A quantizer 145 receives output of the third summation device 115 and generates a digital output signal. The quantizer 145 is a single bit quantizer or a multi-bit quantizer. A delay element 150 is coupled to the output of the quantizer 145 and generates a delayed digital output signal Dout. The delayed digital output signal Dout is provided to a digital to analog converter (DAC) 155 as a feedback signal. The first negative feedback coefficient multiplier 130, the second negative feedback coefficient multiplier 135 and the third negative feedback coefficient multiplier 140 receives output of the DAC 155. In some embodiments, the delta sigma modulator 100 comprises a first DAC providing signal to the first negative feedback coefficient multiplier 130, a second DAC providing signal to the second negative feedback coefficient multiplier 135, and a third DAC providing signal to the third negative feedback coefficient multiplier 140.

The operation of the delta sigma modulator 100 illustrated in FIG. 1 is explained now. The analog input signal Vin is a voltage signal. In some embodiments, the analog input signal Vin is either a current signal or a charge signal. In some embodiments, the analog input signal Vin is at least one of a single ended signal and a differential signal. The first summation device 105 subtracts the output of a first negative feedback coefficient multiplier 130 from the analog input signal Vin. The first negative feedback coefficient multiplier 130 multiples the analog signal received from the DAC 155 with a coefficient K1. The output of first summation device 105 is provided to the first integrator 120 with an ideal response of $1/(sT_1)$, where $T_1$ corresponds to a time constant. The first integrator 120 is a continuous time integrator. The second summation device 110 computes the difference between the output of the first integrator 120 and the signal from the second negative feedback coefficient multiplier 135. The second feedback coefficient multiplier 135 multiplies the analog signal received from the DAC 155 with a coefficient K2. The second integrator 125 receives output of the second summation device 110. The second integrator 125 is a continuous time integrator with an ideal response of $1/(sT_2)$, where $T_2$ corresponds to a time constant. In some embodiments, the first integrator or the second integrator is implemented as either a passive or an active integrator. In some embodiments, time constant $T_1$ is equal to time constant $T_2$. In an embodiment, the first integrator is a continuous time filter with transfer function H(s). The third summation device 115 computes the difference between the output of the second integrator 125 and the signal from the third negative feedback coefficient multiplier 140. The third feedback coefficient multiplier 140 multiples the analog signal received from the digital to analog converter (DAC) 155 with a coefficient K3. The third summation device 115 consumes significant portion of the overall power consumed by the delta sigma modulator 100 as it is realized using a transconductance cell. In some embodiments, the third summation device 115 consumes 40-50% of the overall power consumed by the delta sigma modulator 100. The third summation device 115 is required to add a fast local feedback path with K3 coefficient to compensate for the excess delay in the feedback loop through first and second integrators. Thus, the fast local feedback path provides stability to the delta sigma modulator 100. The analog signal from the third summation device 115 is fed to the quantizer 145 to generate a digital output signal. A pre-determined delay is added to the digital output signal from the quantizer 145 by the delay element 150 which generates a delayed digital output signal Dout. The delayed digital output signal Dout is provided to the DAC 155 as a feedback signal. The first negative feedback coefficient multiplier 130, the second negative feedback coefficient multiplier 135, the third negative feedback coefficient multiplier 140 receives output of the DAC 155. In one embodiment, at least one of the first negative feedback coefficient multiplier 130, the second negative feedback coefficient multiplier 135 and the third negative feedback coefficient multiplier 140 is a weighted DAC.

Figure 2:
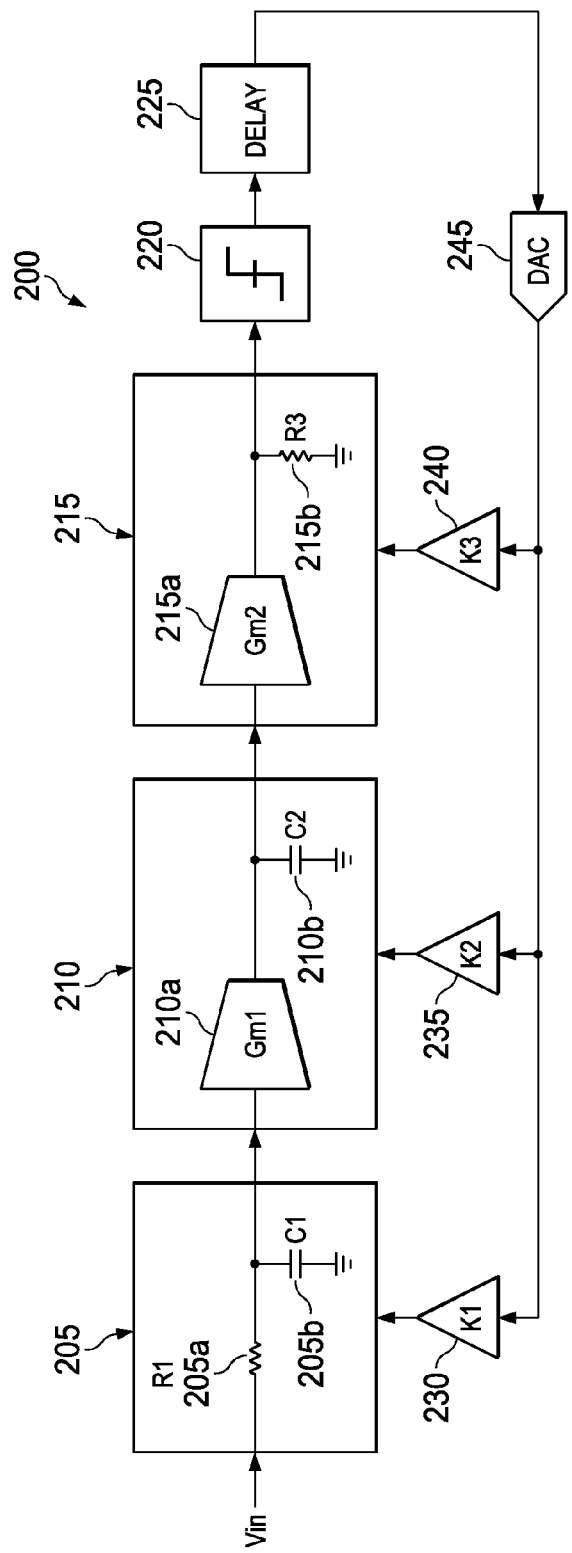
FIG. 2 illustrates implementation of a Delta Sigma modulator.

FIG. 2 illustrates implementation of a delta sigma modulator 200. The delta sigma modulator 200 is one of the ways of implementing delta sigma modulator 100 described in FIG. 1. It is to be noted that in some embodiments the delta sigma modulator 100 can be implemented using other devices or circuit blocks that are not illustrated in FIG. 2. The delta sigma modulator 200 includes a first integrator 205 that receives an analog input signal Vin. The first integrator 205 also receives output of a first negative feedback coefficient multiplier 230. The first negative feedback coefficient multiplier 230 multiples the analog signal received from a digital to analog converter (DAC) 245 with a coefficient K1. The first integrator 205 further includes a passive transconductance element R1 205a and a first integrating capacitor C1 205b. In some embodiments, the first integrator 205 includes an active transconductance element and an integrating capacitor. In an embodiment, the first integrator is a continuous time filter with transfer function H(s). A second integrator 210 is coupled to an output of the first integrator 205. The second integrator 210 also receives output of a second negative feedback coefficient multiplier 235. The second negative feedback coefficient multiplier 235 multiples the analog signal received from the DAC 245 with a coefficient K2. The second integrator 210 further includes a transconductance element Gm1 210a and a second integrating capacitor C2 210b. In some embodiments, the second integrator includes a passive transconductance element and an integrating capacitor. In one embodiment, at least one of the first integrator and the second integrator is operational amplifier based integrator. The operational amplifier based integrator includes a transconductance element at an input terminal and a feedback capacitor between the input terminal and an output terminal.

A summation device 215 is further coupled to an output of the second integrator 210. The summation device 215 is further coupled to receive output of a third negative feedback coefficient multiplier 240. The third negative feedback coefficient multiplier 240 multiples the analog signal received from the DAC 245 with a coefficient K3. The summation device 215 further includes a transconductance element Gm2 215a and a load resistor R3 215b. In some embodiments, the summation device 215 includes an op-amp (operational amplifier), one or more input resistors and a feedback resistor. The transconductance element Gm2 215a consumes a significant portion of the total power consumed by the delta sigma modulator 200. In some embodiments, the transconductance element Gm2 215a consumes 40-50% of the total power consumed by the delta sigma modulator 200. A quantizer 220 receives an output of the third integrator 215 and generates a digital output signal. The quantizer 220 is a single bit quantizer or a multi-bit quantizer. A delay element 225 is coupled to an output of the quantizer 220 and generates a delayed digital output signal Dout. The delayed digital output signal Dout is provided to the DAC 245 as a feedback signal. The first negative feedback coefficient multiplier 230, the second negative feedback coefficient multiplier 235, and the third negative feedback coefficient multiplier 240 receives output of the DAC 245. In one embodiment, at least one of the first negative feedback coefficient multiplier 230, the second negative feedback coefficient multiplier 235 and the third negative feedback coefficient multiplier 240 is a weighted DAC. The functioning of the delta sigma modulator 200 is similar to delta sigma modulator 100 illustrated in FIG. 1 and hence is not repeated for the sake of simplicity.

Figure 3:
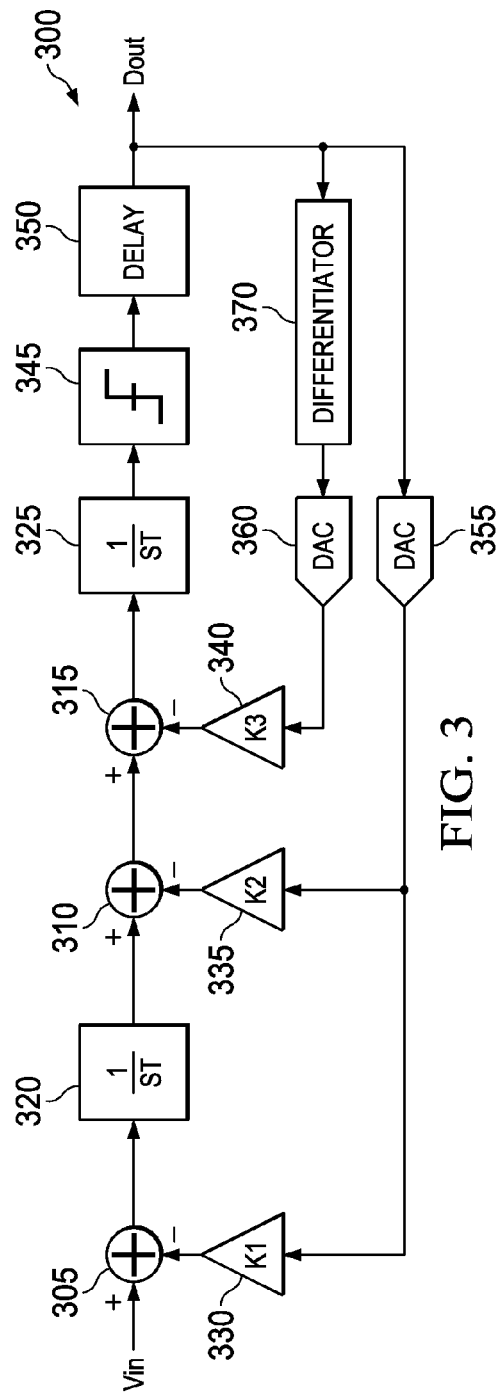
FIG. 3 illustrates architecture of a Delta Sigma modulator according to an embodiment.

FIG. 3 illustrates architecture of a delta sigma modulator 300 according to an embodiment. The delta sigma modulator 300 includes a first summation device 305 that receives an analog input signal Vin. The first summation device 305 also receives an output of a first negative feedback coefficient multiplier 330. A first integrator 320 is coupled to an output of the first summation device 305. A second summation device 310 receives output of the first integrator 320. The second summation device 310 also receives output of a second negative feedback coefficient multiplier 335. A third summation device 315 receives output of the second summation device 310. The third summation device 315 also receives output of a third negative feedback coefficient multiplier 340. A second integrator 325 is coupled to an output of the third summation device 315. A quantizer 345 receives output of the second integrator 325 and generates a digital output signal. The quantizer 345 is a single bit quantizer or a multi-bit quantizer. A delay element 350 is coupled to an output of the quantizer 345 and generates a delayed digital output signal Dout. The delayed digital output signal Dout is provided to a first digital to analog converter (DAC) 355 and a differentiator 370 as a feedback signal. The first negative feedback coefficient multiplier 330 and the second negative feedback coefficient multiplier 335 receive output of the first DAC 355. The third negative feedback coefficient multiplier 340 receives output of a second DAC 360. The second DAC 360 is coupled to an output of the differentiator 370. In one embodiment, at least one of the first negative feedback coefficient multiplier 330, the second negative feedback coefficient multiplier 335 and the third negative feedback coefficient multiplier 340 is a weighted DAC.

The operation of the delta sigma modulator 300 illustrated in FIG. 3 is explained now. The analog input signal Vin is a voltage signal. In some embodiments, the analog input signal Vin is a current signal or a charge signal. In some embodiments, the analog input signal Vin is at least one of single ended signal and a differential signal. The first summation device 305 subtracts the output of a first negative feedback coefficient multiplier 330 from the analog input signal Vin. The first negative feedback coefficient multiplier 330 multiples the analog signal received from the first DAC 355 with a coefficient K1. The output of the first summation device 305 is provided to the first integrator 320 with an ideal response of $1/(sT_1)$, where $T_1$ corresponds to a time constant. The first integrator 320 is a continuous time integrator. The second summation device 310 computes difference between the output of the first integrator 320 and the output of the second negative feedback coefficient multiplier 335. The second negative feedback coefficient multiplier 335 multiplies the analog signal received from the first DAC 355 with a coefficient K2. The third summation device 315 computes the difference between the output of the second summation device 310 and the output of third negative feedback coefficient multiplier 340. The third negative feedback coefficient multiplier 340 multiplies the analog signal received from the second DAC 360 with a coefficient K3. The second integrator 325 receives output of the third summation device 315. The second integrator 325 is a continuous time integrator with an ideal response of $1/(sT_2)$, where $T_2$ is a time constant. In some embodiments, time constant $T_1$ is equal to time constant $T_2$. In an embodiment, the first integrator is a continuous time filter with transfer function H(s). In some embodiments, at least one of the first integrator and the second integrator is a passive integrator, a transconductance integrator and an op-amp integrator. The analog signal from the second integrator 325 is fed to the quantizer 345 to generate the digital output signal. A pre-determined delay is added to the digital output signal from the quantizer 345 by the delay element 350 which generates a delayed digital output signal Dout. The delayed digital output signal Dout is provided to the first DAC 355 and the differentiator 370 as a feedback signal. The differentiator 370, the second DAC 360, the third negative feedback coefficient multiplier 340, the third summation device 315 and the second integrator 325 are used to realize a fast local feedback path. The fast local feedback path is required to compensate for the excess delay in the feedback loop through the first integrator 320. Thus, the fast local feedback path provides stability to the delta sigma modulator 300.

Figure 4:
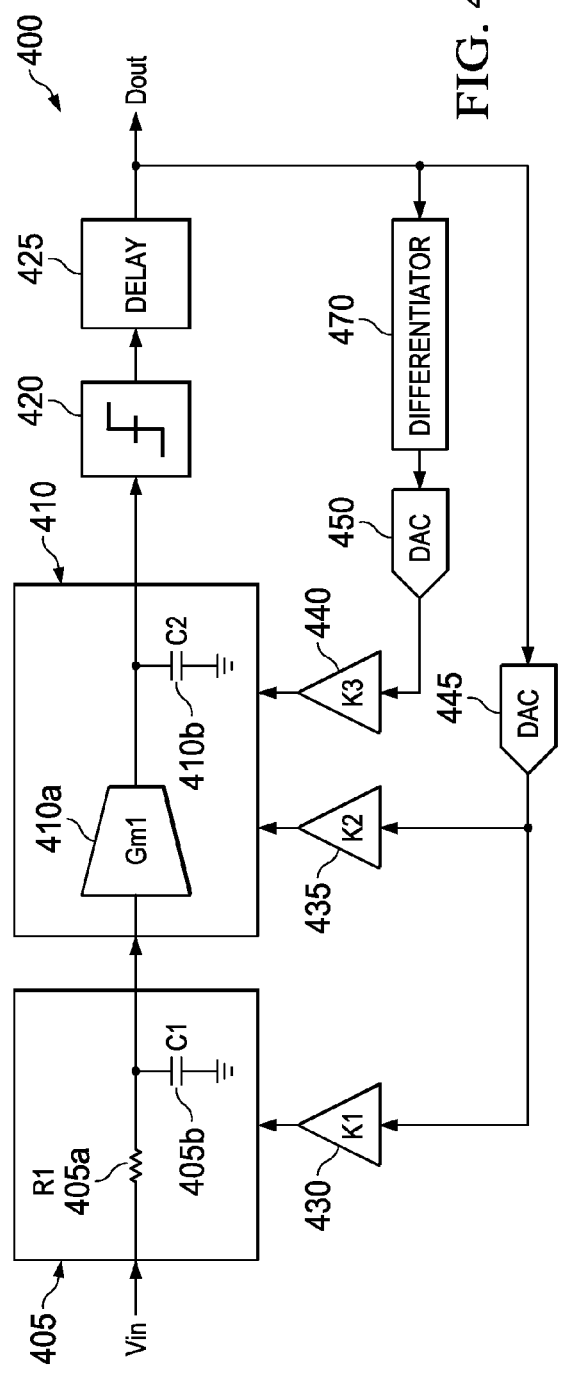
FIG. 4 illustrates implementation of a Delta Sigma modulator according to another embodiment.

FIG. 4 illustrates implementation of a delta sigma modulator 400 according to an embodiment. The delta sigma modulator 400 is one of the ways of implementing delta sigma modulator 300 described in FIG. 3. It is to be noted that in some embodiments the delta sigma modulator 300 can be implemented using other devices or circuit blocks that are not illustrated in FIG. 4. The delta sigma modulator 400 includes a first integrator 405 that receives an analog input signal Vin. The first integrator 405 also receives output of a first negative feedback coefficient multiplier 430. The first negative feedback coefficient multiplier 430 multiples the analog signal received from a first digital to analog converter (DAC) 445 with a coefficient K1. The first integrator 405 further includes a passive transconductance element R1 405a and a first integrating capacitor C1 405b. In some embodiments, the first integrator 405 includes an active transconductance element and an integrating capacitor. In an embodiment, the first integrator is a continuous time filter with transfer function H(s). A second integrator 410 receives a first output signal from the first integrator 405. The second integrator 410 also receives output of a second negative feedback coefficient multiplier 435 and an output of a third negative feedback coefficient multiplier 440. The second integrator 410 further includes a transconductance element Gm1 410*a* and a second integrating capacitor C2 410*b*. In some embodiments, the second integrator includes a passive transconductance element and an integrating capacitor. In one embodiment, at least one of the first integrator and the second integrator is operational amplifier based integrator. The operational amplifier based integrator includes a transconductance element at an input terminal and a feedback capacitor between the input terminal and an output terminal. In some embodiments, the first negative feedback coefficient multiplier 430 and the second negative feedback coefficient multiplier 435 are not required and the first integrator 405 and the second integrator 410 receive a first analog signal from first DAC 445. In one embodiment, at least one of the first negative feedback coefficient multiplier 430, the second negative feedback coefficient multiplier 435 and the third negative feedback coefficient multiplier 440 is a weighted DAC.

A quantizer 420 receives a second output signal from the second integrator 410 and generates a digital output signal. The quantizer 420 is a single bit quantizer or a multi-bit quantizer. A delay element 425 is coupled to an output of the quantizer 420 and generates a delayed digital output signal Dout. The delayed digital output signal Dout is provided to a first digital to analog converter (DAC) 445 and a differentiator 470 as a feedback signal. The first negative feedback coefficient multiplier 430 and the second negative feedback coefficient multiplier 435 receive output of the first DAC 445. The third negative feedback coefficient multiplier 440 receives output of a second DAC 450. The second DAC 450 is coupled to the output of the differentiator 470. The differentiator 470 differentiates the delayed digital output signal to generate a differentiated signal. In some embodiments, the third negative feedback coefficient multiplier 440 is not required and the second integrator 410 receives a second analog signal from second DAC 450. The differentiator 470, the second DAC 450, the third negative feedback coefficient multiplier 440 and the second integrating capacitor C2 410*b* are used to realize a fast local feedback path. Since this implementation eliminates the additional transconductance element that was required in delta sigma modulator 200, it saves a significant portion of the power required by the circuit. In some embodiments, the elimination of the additional transconductance element results in 40-50% less energy consumption. In addition, the delta sigma modulator 400 also provides exact compensation for the delay caused by clock and hence provides an exact noise transfer function (NTF). The functioning of the delta sigma modulator 400 is similar to delta sigma modulator 300 illustrated in FIG. 3 and hence is not repeated for the sake of simplicity.

Figure 5:
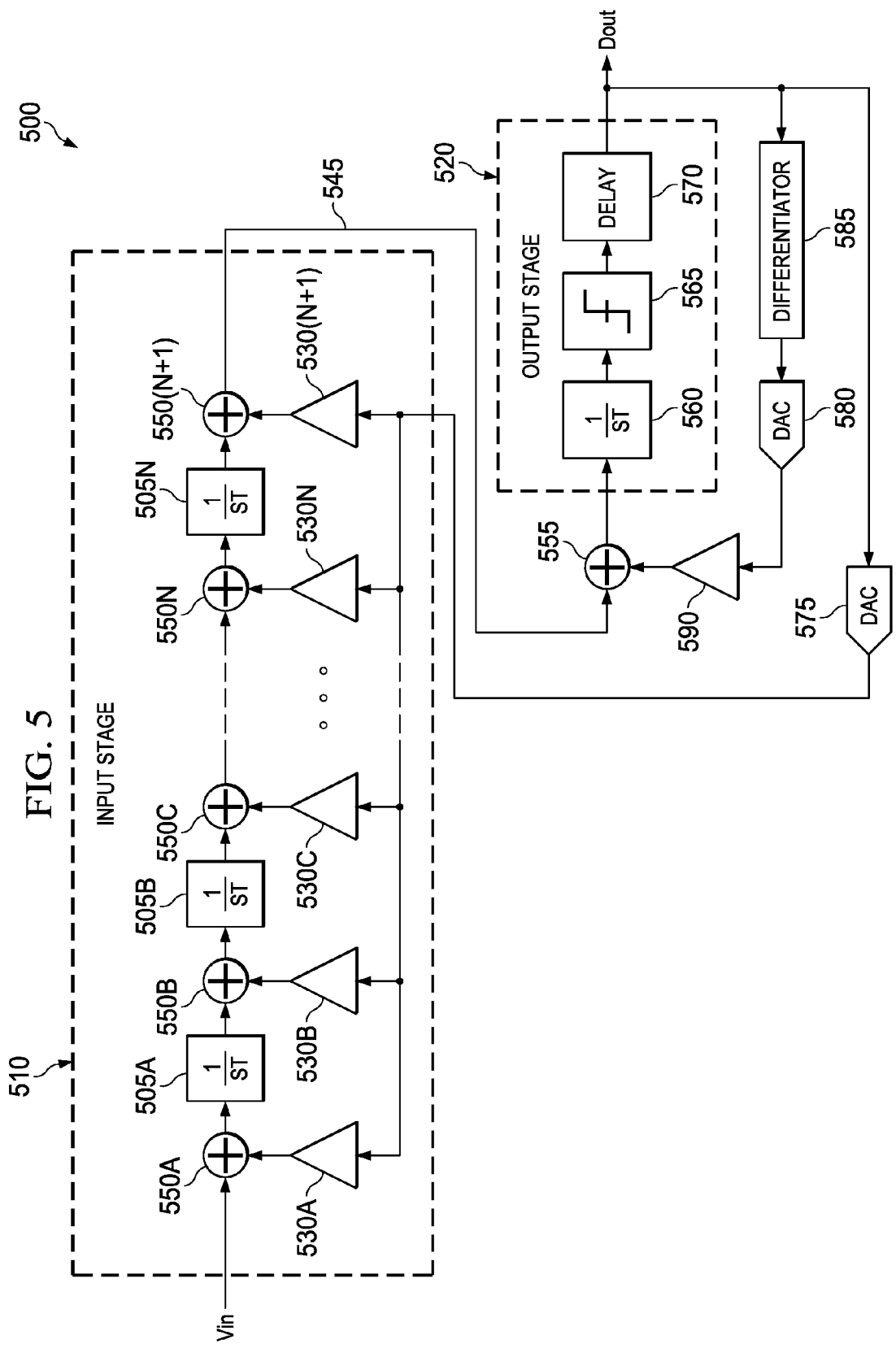
FIG. 5 illustrates architecture of a $N^{th}$ order Delta Sigma modulator according to an embodiment.

FIG. 5 illustrates architecture of an $N^{th}$ order delta sigma modulator 500 according to an embodiment. The architecture in FIG. 3 is augmented with integrators, summation devices and negative feedback coefficient multipliers. The delta sigma modulator 500 includes N+1 summation device 550A, 550B ... 550N, 550(N+1), N being an integer greater than or equal to 1. The first summation device 550A receives an analog input signal Vin. The analog input signal Vin is a voltage signal. In some embodiments, the analog input signal Vin is either a current signal or a charge signal. The delta sigma modulator 500 further includes N+1 negative feedback coefficient multipliers. The output of N+1 negative feedback coefficient multipliers are received by N+1 summation devices. For example, summation device 550A receives signal from negative feedback coefficient multiplier 530A and summation device 550B receives signal from negative feedback coefficient multiplier 530B. The output of N summation devices is received by N integrators for example integrator 505A receives output of summation device 550A and integrator 505B receives output of summation device 550B. The output of $N+1^{th}$ integrator is a processed error signal 545 which is received at an additional summation device 555. The N+1 summation devices, N integrators and N+1 negative feedback coefficient multipliers form an input stage 510 of the delta sigma modulator 500. The additional summation device 555 also receives a second analog signal which is output of an additional negative feedback coefficient multiplier 590. The additional summation device 555 generates a second output signal. The second output signal is received at an output stage 520 which includes an additional integrator 560, a quantizer 565 and a delay element 570 arranged in series. The additional integrator 560 receives output of the additional summation device 555. The quantizer 565 is coupled to the output of the additional integrator 560 and generates a digital output signal. The quantizer 565 is a single bit quantizer or a multi-bit quantizer. The delay element 570 receives the digital output signal and generates a delayed digital output signal Dout. The digital output signal Dout is received by a first digital to analog converter (DAC) 575 as a feedback signal and generates a first analog signal. The delayed digital output signal Dout is received by a differentiator 585 as a feedback signal. The N feedback coefficient multipliers 530A, 530B ..., 530N receive output of the first DAC 575 or the first analog signal. The additional negative feedback coefficient multiplier 590 receives output of a second DAC 580. The second DAC 580 is coupled to the output of the differentiator 585. The differentiator 585 generates a differentiated signal from the delayed digital output signal Dout. It is to be noted that in some embodiments N negative feedback coefficient multipliers can receive output of N DACs. Also, in some embodiments, a first set of negative feedback coefficient multipliers receive output of first set of DAC and a second set of negative feedback coefficient multipliers receive output of second set of DAC. The Nth order delta sigma modulator 500 is used to implement specific noise transfer function (NTF) and signal transfer function.

FIG. 6 is a table comparing the power consumed by one example embodiment of the delta sigma modulator 100 (Column 1) and power consumed by one example embodiment of the delta sigma modulator 300 (Column 2). From the table, it is seen in Row 2 that the power consumed by the summation device 115 in delta sigma modulator 100 is 35 uW whereas this is 0 in delta sigma modulator 300 as the summation device after the second integrator 325 is not present in the delta sigma modulator 300. As illustrated in FIG. 4, which is one of the ways of implementation of delta sigma modulator 300, the transconductance element Gm2 215*a* (FIG. 2) is not required in delta sigma modulator 400. The main advantage of the delta sigma modulator 300 is the power savings at the chip level. There is a reduction of approximately 46% in the total power consumed when delta sigma modulator 300 is used.

In the foregoing discussion, the terms "connected" means at least either a direct electrical connection between the devices connected or an indirect connection through one or more passive intermediary devices. The term "circuit" means at least either a single component or a multiplicity of passive or active components, that are connected together to provide a desired function. The term "signal" means at least one current, voltage, charge, data, or other signal. Also, the terms "coupled to" or "couples with" (and the like) are intended to describe either an indirect or direct electrical connection.

Thus, if a first device is coupled to a second device, that connection can be through a direct electrical connection, or through an indirect electrical connection via other devices and connections. Further, the term "high" is generally intended to describe a signal that is at logic state "1," and the term "low" is generally intended to describe a signal that is at logic state "0."

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A delta sigma modulator comprising:
   a first summation device configured to receive an analog input signal and an output signal from a first negative feedback coefficient multiplier;
   a first integrator configured to receive an output of the first summation device;
   a second summation device coupled to an output of the first integrator and configured to receive a signal from a second negative feedback coefficient multiplier;
   a third summation device coupled to an output of the second summation device and configured to receive a signal from a third negative feedback coefficient multiplier;
   a second integrator configured to receive an output of the third summation device;
   a quantizer configured to receive an output of the second integrator and generate a digital output signal;
   a delay element configured to receive the digital output signal and generate a delayed digital output signal;
   a first digital to analog converter (DAC) configured to provide an output signal to the first negative feedback coefficient multiplier and the second negative feedback coefficient multiplier, wherein the first DAC is configured to receive the delayed digital output signal, thereby forming a feedback loop;
   a second DAC configured to provide an output to the third negative feedback coefficient multiplier; and
   a differentiator configured to provide an output to the second DAC, wherein the differentiator is configured to receive the delayed digital output signal as a feedback signal.

2. The delta sigma modulator of claim 1, wherein analog input signal is at least one of voltage signal, a current signal, and a charge signal.

3. The delta sigma modulator of claim 2, wherein the voltage signal, current signal and charge signal is at least one of single ended signal and a differential signal.

4. The delta sigma modulator of claim 1, wherein the first integrator and the second integrator is at least one of a passive integrator, a transconductance integrator and an op-amp integrator.

5. The delta sigma modulator of claim 1, wherein at least one of the first negative feedback coefficient multiplier, the second negative feedback coefficient multiplier and the third negative feedback coefficient multiplier is a weighted DAC.

6. The delta sigma modulator of claim 1, wherein the delay element is configured to provide a pre-determined delay to the digital output signal from the quantizer.

7. A delta sigma modulator comprising:
   a first integrator configured to receive an analog input signal and a signal from a first negative feedback coefficient multiplier;
   a second integrator coupled to an output of the first integrator and configured to receive a signal from a second negative feedback coefficient multiplier and a signal from a third negative feedback coefficient multiplier;
   a quantizer coupled to an output of the second integrator and configured to generate a digital output signal;
   a delay element configured to receive the digital output signal and generate a delayed digital output signal;
   a first digital to analog converter (DAC) configured to provide an output signal to the first negative feedback coefficient multiplier and the second negative feedback coefficient multiplier, wherein the first DAC is configured to receive the delayed digital output signal, thereby forming a feedback loop;
   a second DAC configured to provide an output to the third negative feedback coefficient multiplier; and
   a differentiator configured to provide an output to the second DAC, wherein the differentiator is configured to receive the delayed digital output signal as a feedback signal.

8. The delta sigma modulator of claim 7, wherein the first integrator and the second integrator are each one of a passive integrator, a transconductance integrator and an op-amp integrator.

9. The delta sigma modulator of claim 8, wherein the passive integrator comprises a passive transconductance element and a first integrating capacitor, wherein one end of the first integrating capacitor receives a signal from the passive transconductance element and the other end is coupled to a ground terminal.

10. The delta sigma modulator of claim 8, wherein the transconductance integrator comprises an active transconductance element and a second integrating capacitor wherein one end of the second integrating capacitor receives a signal from the active transconductance element and the other end is coupled to the ground terminal.

11. The delta sigma modulator of claim 7, wherein at least one of the first negative feedback coefficient multiplier, the second negative feedback coefficient multiplier and the third negative feedback coefficient multiplier is a weighted DAC.

12. A method of generating a delayed digital output signal in a delta sigma modulator responsive to an analog input signal, comprising:
   integrating the analog input signal and a first analog signal to generate a first output signal;
   integrating the first analog signal, the first output signal and a second analog signal to generate a second output signal;
   quantizing the second output signal to generate a digital output signal; and
   delaying the digital output signal to generate the delayed digital output signal.

13. The method of claim 12 further comprising differentiating the delayed digital output signal to generate a differentiated signal, wherein the second analog signal is generated from the differentiated signal and the first analog signal is generated from the delayed digital output signal.

14. A delta sigma modulator comprising:
   an input stage configured to receive an analog input signal and generate a processed error signal;
   an additional summation device configured to receive the processed error signal and an output of a differentiator;

an output stage configured to receive an output of the additional summation device and generate a delayed digital output signal, wherein the differentiator receives the delayed digital output signal as feedback signal; and a first digital to analog converter (DAC) configured to receive the delayed digital output signal as feedback signal, wherein the input stage is configured to receive an output of the first DAC.

15. The delta sigma modulator of claim 14 further comprising a second DAC configured to receive output of the differentiator and provide an output to an additional negative feedback coefficient multiplier, wherein the additional summation device is configured to receive output of the additional negative feedback coefficient multiplier.

16. The delta sigma modulator of claim 14, wherein the output stage comprises:

an additional integrator configured to receive the output of the summation device;

a quantizer configured to receive output of the additional integrator and generates a digital output signal; and a delay element configured to receive the digital output signal and generate a delayed digital output signal.

17. The delta sigma modulator of claim 14, wherein the input stage comprises:

N+1 summation devices, N being an integer greater than or equal to 1, wherein a first summation device of the N+1 summation devices receives the analog input signal and a last summation device of the N+1 summation devices generates the processed error signal; and N integrators, wherein the N+1 summation devices and the N integrators are arranged alternately such that each integrator of the N integrators receives an output signal from a summation device of the N+1 summation devices and an N+1$^{th}$ summation device receives an output of N$^{th}$ integrator.

18. The delta sigma modulator of claim 17, wherein N+1 summation devices are configured to receive output signal of N+1 negative feedback coefficient multipliers and each negative feedback coefficient multiplier of N+1 negative feedback coefficient multipliers is configured to receive the output of the first DAC.

19. A method of generating a delayed digital output signal in a delta sigma modulator responsive to an analog input signal, comprising:

generating a processed error signal from the analog input signal and a first analog signal;

summing the processed error signal and a second analog signal to generate a second output signal;

integrating and quantizing the second output signal to generate a digital output signal;

delaying the digital output signal to generate a delayed digital output signal; and differentiating the delayed digital output signal to generate a differentiated signal, wherein the second analog signal is generated from the differentiated signal and the first analog signal is generated from the delayed digital output signal.

20. The method of claim 19 further comprising providing the differentiated signal to a second DAC (digital to analog converter), and providing an output of the second DAC to an additional negative feedback coefficient multiplier to generate the second analog signal.

* * * * *